(12) United States Patent
Oh et al.

(10) Patent No.: US 11,539,029 B2
(45) Date of Patent: Dec. 27, 2022

(54) DISPLAY DEVICE WITH BENDING PROTECTIVE LAYER

(71) Applicant: SAMSUNG DISPLAY CO., LTD., Yongin-si (KR)

(72) Inventors: Aely Oh, Hwaseong-si (KR); Byoung Dae Ye, Yongin-si (KR); Junwoo You, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/402,705

(22) Filed: Aug. 16, 2021

(65) Prior Publication Data

US 2022/0199945 A1 Jun. 23, 2022

(30) Foreign Application Priority Data

Dec. 23, 2020 (KR) .................. 10-2020-0182139

(51) Int. Cl.
| | |
|---|---|
| *H01L 51/52* | (2006.01) |
| *G09G 3/3208* | (2016.01) |
| *G09G 3/00* | (2006.01) |
| *H01L 27/32* | (2006.01) |
| *H01L 51/00* | (2006.01) |

(52) U.S. Cl.
CPC ......... *H01L 51/5253* (2013.01); *G09G 3/035* (2020.08); *G09G 3/3208* (2013.01); *H01L 27/3276* (2013.01); *H01L 51/0097* (2013.01); *G09G 2300/0426* (2013.01); *H01L 2251/5338* (2013.01); *H01L 2251/5369* (2013.01)

(58) Field of Classification Search
CPC ............. H01L 51/5253; H01L 51/0097; H01L 27/3276; G09G 3/035; G09G 3/3208; G09G 3/3258; G09G 3/3233; G09G 3/3291; G09G 3/3225; H05K 1/0277; H05K 1/028; H05K 1/0281; H05K 1/0283

See application file for complete search history.

(56) References Cited

U.S. PATENT DOCUMENTS

| | | |
|---|---|---|
| 9,544,994 B2 | 1/2017 | Kwon et al. |
| 9,740,035 B2 | 8/2017 | Kwon et al. |
| 10,356,896 B2 * | 7/2019 | Iwase .................... H05K 1/092 |

FOREIGN PATENT DOCUMENTS

| | | |
|---|---|---|
| KR | 10-1284873 | 6/2013 |
| KR | 10-2014-0038680 | 3/2014 |
| KR | 10-2019-0005285 | 1/2019 |

* cited by examiner

*Primary Examiner* — Sardis F Azongha
(74) *Attorney, Agent, or Firm* — F. Chau & Associates, LLC (57) ABSTRACT

A display device includes a substrate including a display area and a bending area adjacent to the display area, a conductive layer disposed on the substrate in the bending area, where the conductive layer is configured to transmit driving signals from a driving circuit to a display unit, and a bending protective layer disposed on the conductive layer in the bending area. The bending protective layer includes conductive particles. In the case of a crack in the conductive layer, the conductive particles within the bending protective layer may freely move and fill into the conductive layer, preventing a decrease in display performance.

20 Claims, 9 Drawing Sheets

DISPLAY DEVICE WITH BENDING PROTECTIVE LAYER

CROSS-REFERENCE TO RELATED APPLICATION

This application claims priority under 35 U.S.C. § 119 to Korean Patent Application No. 10-2020-0182139 filed on Dec. 23, 2020 in the Korean Intellectual Property Office, (KIPO), the entire disclosure of which is incorporated by reference herein in its entirety.

TECHNICAL FIELD

The present disclosure generally relates to a display device. More specifically, the present disclosure relates to a display device including a bending protective layer.

DISCUSSION OF THE RELATED ART

Display devices are used to provide information to a user by displaying images, video, user interfaces, and the like. Such display devices may include flat panel displays (FPDs) such as liquid crystal displays (LCDs), organic light emitting diodes (OLEDs) and plasma display panels (PDPs).

Recent advances in display device technology have allowed for improved visibility from various angles as well as reduced sizes of non-display areas by manufacturing display devices that have a bent portion. However, when conventional display devices are bent as described, cracks or structural failures may occur at the bent portion, and the display performance of the display devices may decrease.

SUMMARY

Embodiments provides a display device for preventing the display performance from being decreased due to an occurrence of a crack when the display device is bent.

A display device according to embodiments may include a substrate including a display area and a bending area adjacent to the display area, a conductive layer disposed on the substrate in the bending area, where the conductive layer is configured to transmit driving signals from a driving circuit to a display unit, and a bending protective layer disposed on the conductive layer in the bending area, and the bending protective layer may include conductive particles.

In one embodiment, the conductive particles may be able to freely pass within the bending protective layer.

In one embodiment, when the substrate is bent and a crack occurs in the conductive layer, the conductive particles may fill in the crack.

In one embodiment, the conductive layer may directly contact the bending protective layer in the bending area.

In one embodiment, the bending protective layer may include cross-linking polymer.

In one embodiment, the conductive particles may include metal.

In one embodiment, the metal may include aluminum (Al), silver (Ag), gold (Au), copper (Cu), iron (Fe), molybdenum (Mo), lead (Pb), zinc (Zn), or a combination thereof.

In one embodiment, the conductive particles may include conductive polymer.

In one embodiment, the conductive polymer may be poly(3,4-ethylenedioxythiophene) polystyrene sulfonate (PEDOT:PSS), polypyrrole, polyfuran, polythiophene, polyselenophene, 3,4-ethylenedioxythiophene (EDOP), 3,4-ethylenedioxyselenophene (EDOS), polyacetylene (PA), or polyaniline (PAI).

In one embodiment, the conductive particles may have a spherical shape, a triangular pyramid shape, or a rectangular parallelepiped shape.

In one embodiment, the conductive particles may have a dendrite shape.

In one embodiment, the display device may further include a passivation layer disposed between the conductive layer and the bending protective layer in the bending area.

In one embodiment, when the substrate is bent and a crack occurs in the conductive layer and passivation layer, the conductive particles may fill in the crack.

A display device according to embodiments may include a substrate including a display area, a first bending area spaced apart from the display area and a second bending area positioned between the display area and the first bending area, a conductive layer disposed on the substrate in the first bending area and the second bending area, a passivation layer disposed on the conductive layer in the second bending area, and a bending protective layer disposed on the conductive layer in the first bending area, and disposed on the passivation layer in the second bending area, and the bending protective layer may include conductive particles.

In one embodiment, the conductive particles may be movable within the bending protective layer.

In one embodiment, the conductive layer may come into direct contact with the bending protective layer in the first bending area.

In one embodiment, when the substrate is bent and a crack occurs in the conductive layer in the first bending area, the conductive particles may fill in the crack.

In one embodiment, when the substrate is bent and a crack occurs in the conductive layer and passivation layer in the second bending area, the conductive particles may fill in the crack.

In one embodiment, the substrate may further include a third bending area adjacent to the first bending area and spaced apart from the second bending area, the conductive layer may be disposed on the substrate in the third bending area, the passivation layer may be disposed on the conductive layer in the third bending area, and the bending protective layer may be disposed on the passivation layer in the third bending area.

In one embodiment, when the substrate is bent and a crack occurs in the conductive layer and passivation layer in the third bending area, the conductive particles may fill in the crack.

The bending protective layer of the display device according to the embodiments may include conductive particles, and when a crack occurs in the conductive layer while the display device is bent, the conductive particles may fill inside the crack. Accordingly, even when the crack occurs in the process of bending the display device, the display performance of the display device may be prevented from being decreased.

DETAILED DESCRIPTION OF THE EMBODIMENTS

The present disclosure describes a display device capable of maintaining performance even in the case of a crack occurring in its conductive layer. In one example of the inventive concepts described herein, a bending protective layer may be disposed on the conductive layer in a bending area of the display device substrate. The bending protective layer may mitigate a tensile stress applied to the conductive layer, thereby preventing cracks. Further, the bending protective layer may contain conductive particles that freely pass throughout the bending protective layer, and in the case of a crack in the conductive layer, the conductive particles may fill into the gap created in the crack of the conductive layer, thereby ensuring an effective transmission of signals through the conductive layer.

Various example embodiments will be described more fully hereinafter with reference to the accompanying drawings, in which some example embodiments are shown. In the drawings, like numerals may refer to like elements throughout. To the extent that a description of an element has been omitted, it may be understood that the element is at least similar to corresponding elements that are described elsewhere in the specification.

Figure 1:
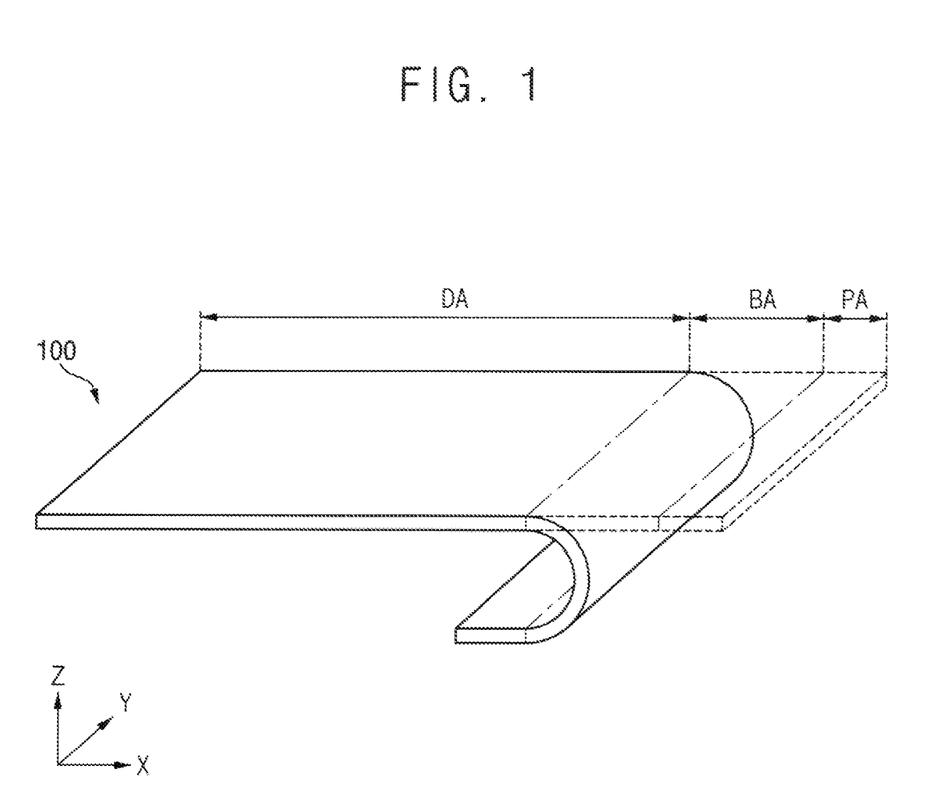
FIG. 1 is a schematic perspective view of a display device according to an embodiment of the present disclosure.
Figure 2:
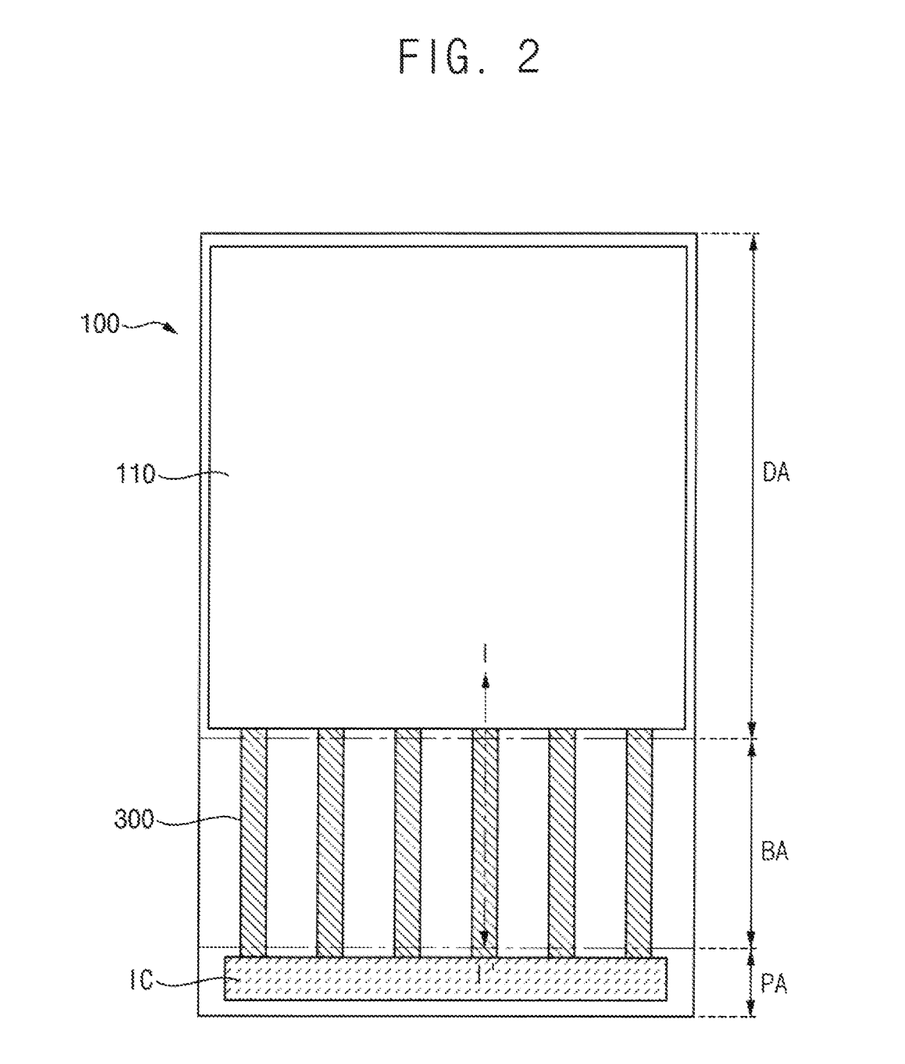
FIG. 2 is a schematic plan view of the display device according to an embodiment of the present disclosure.

FIG. 1 is a schematic perspective view of a display device according to an embodiment of the present disclosure. FIG. 2 is a schematic plan view of the display device according to an embodiment of the present disclosure.

FIG. 1 shows a substrate 100 included in the display device, which includes a bending area BA of the substrate 100 that is illustrated with a solid line to show a bent state and illustrated with a dotted line to show a non-bent state. FIG. 2 shows a substrate 100, a display unit 110, a conductive layer 300, and a driving circuit IC included in the display device.

The display device refers to a device capable of displaying an image. The display device may be a liquid crystal display, an electrophoretic display, an organic light emitting display, an inorganic electro luminescence (EL) display, a field emission display, a surface-conduction electron-emitter display, a plasma display, a cathode ray tube display, or the like. Hereinafter, an organic light emitting display device according to one embodiment of the present disclosure is described as a display device as an example, but the display device of the present disclosure is not necessarily limited thereto and various type of display devices may be used.

The substrate 100 may include a display area DA, a bending area BA, and a driving area PA. The display area DA of the substrate 100 may have a substantially flat surface. The bending area BA may be adjacent to the display area DA. The bending area BA may be an area in which the substrate 100 is bent. The substrate 100 may have a predetermined radius of curvature in the bending area BA. The driving area PA may be adjacent to the bending area BA and may be spaced apart from the display area DA. The substrate 100 may have a flat surface in the driving area PA.

The substrate 100 may include various flexible materials. For example, the substrate 100 may include polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The substrate 100 may be a single layer or include multiple layers. In one embodiment, the substrate 100 may have a structure in which a resin layer formed of resin and a barrier layer formed of an inorganic material such as silicon oxide or silicon nitride are alternately laminated. In the same or another embodiment, the substrate 100 may also have a structure further including an intermediate layer formed of amorphous silicon between the resin layer and the barrier layer.

The display unit 110 may be disposed in the display area DA of the substrate 100. The display unit 110 may be configured to display an image, and may do so by emitting light. Specifically, the display unit 110 may include a plurality of pixels capable of receiving a driving signal to emit light having a luminance corresponding to the driving signal.

The conductive layer 300 may be disposed on the substrate 100 in the bending area BA. The conductive layer 300 may also be disposed in a part of the substrate 100 in the display area DA (for example, a part adjacent of the display area DA that is adjacent to the bending area BA). In addition, the conductive layer 300 may also be disposed in a part of the substrate 100 in the driving area PA (for example, a part adjacent of the driving area PA that is adjacent to the bending area BA). The conductive layer 300 may include a conductive material. For example, the conductive layer 300 may have a single layer or a multilayer structure formed of a conductive material including molybdenum (Mo), aluminum (Al), copper (Cu), titanium (Ti), and the like. The conductive layer 300 may transmit the driving signal generated by the driving circuit IC to the display unit 110.

The driving circuit IC may be disposed on the substrate 100 in the driving area PA. The driving circuit IC may be electrically connected to the conductive layer 300. Accordingly, the driving circuit IC may provide the driving signal to the display unit 110 through the conductive layer 300. The driving signal may contain various signals, such as a driving voltage, a gate signal, and a data signal, that drive the display device.

When the substrate 100 is bent in the bending area BA, a crack may occur in the conductive layer 300 disposed in the bending area BA of the substrate 100. In this case, the driving signal generated by the driving circuit IC may not be effectively provided to the display unit 110. Accordingly, the display performance of the display device may be decreased.

In order to prevent the above-described display performance from being decreased, a bending protective layer (for example, a bending protective layer BPL of FIG. 3) may be disposed on the bending area BA of the substrate 100. The bending protective layer may minimize a tensile stress applied to the conductive layer 300 when the substrate 100 is bent. Accordingly, the bending protective layer may prevent a crack from occurring in the conductive layer 300 due to the bending of the substrate 100.

Specifically, when a laminate is bent (such as a laminate structure included in the substrate 100), a stress neutral plane may exist in the laminate. When the bending protective layer is not provided, an excessive tensile stress may be applied to the conductive layer 300 disposed in the bending area BA as the substrate 100 is bent. This is because a position of the conductive layer 300 may not correspond or be near to or overlap with the stress neutral plane. However, when the bending protective layer is disposed on the bending area BA, and the thickness, modulus and the like of the bending protective layer are adjusted, the position of the stress neutral plane may be adjusted in the laminate including the substrate 100 and the bending protective layer. Accordingly, the stress neutral plane is positioned in the vicinity of the conductive layer 300 through the bending protective layer, so that the tensile stress applied to the conductive layer 300 may be minimized.

Figure 3:
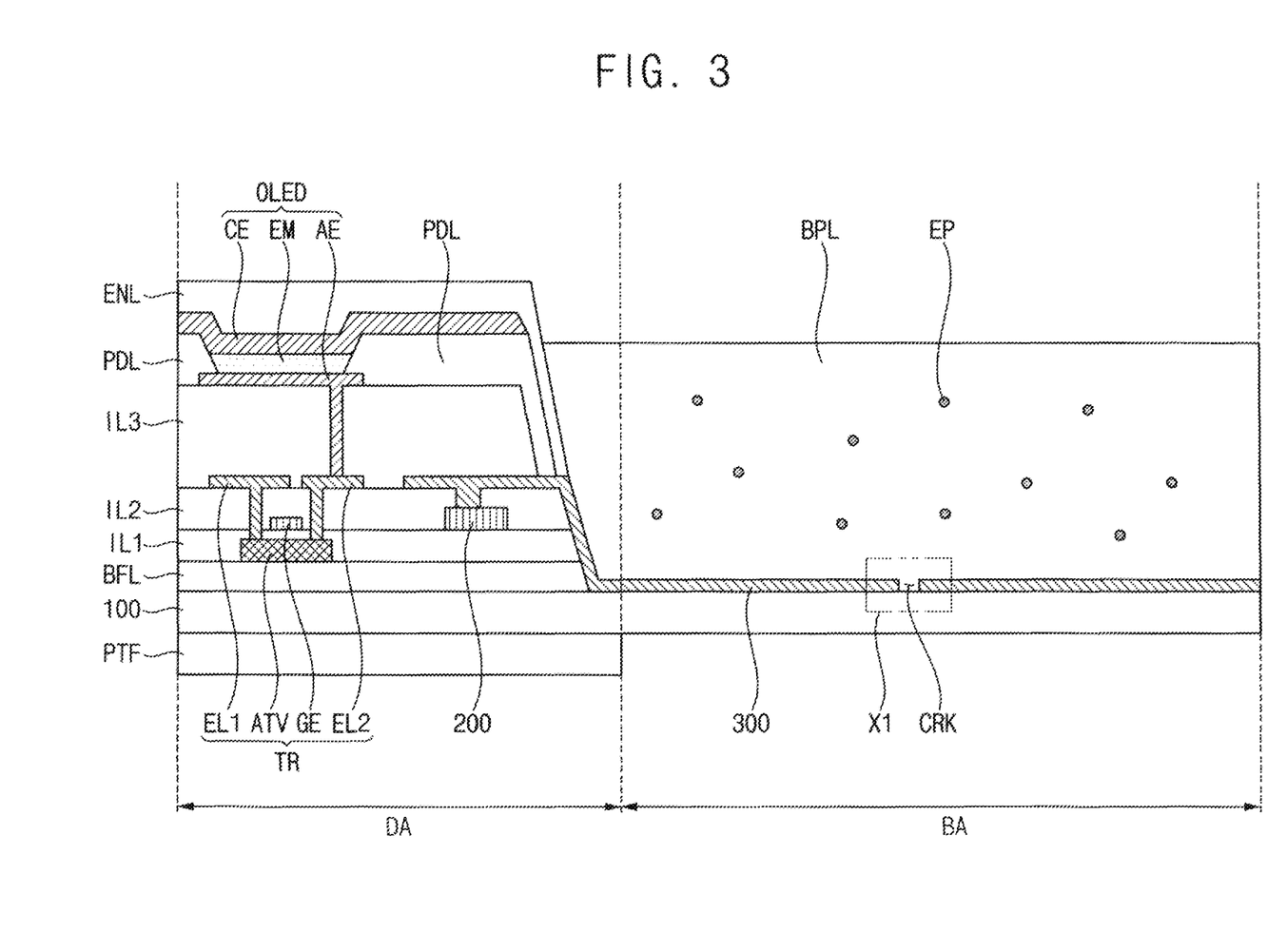
FIG. 3 is a cross-sectional view showing the display device according to an embodiment of the present disclosure.

FIG. 3 is a sectional view showing the display device according to one embodiment of the present disclosure. For example, FIG. 3 may be a cross-sectional view taken along line I-I' of FIG. 2.

Referring to FIG. 3, the display device according to one embodiment of the present disclosure may include a substrate 100, a connection electrode 200, a conductive layer 300, a buffer layer BFL, a protective film PTF, first to third insulating layers IL1, IL2 and IL3, a transistor TR, a pixel definition layer PDL, an organic light emitting device OLED, and a bending protective layer BPL. The transistor TR may include a first electrode EL1, a second electrode EL2, a gate electrode GE, and an active layer ATV. The organic light emitting device OLED may include a cathode electrode CE, an anode electrode AE, and a light emitting layer EM.

In the display area DA, the buffer layer BFL may be disposed on the substrate 100. The buffer layer BFL may substantially flatten a top surface of the substrate 100, or prevent or minimize impurities passing through the substrate 100 from penetrating into the active layer ATV of the transistor TR. The buffer layer BFL may include inorganic materials such as silicon oxide, silicon nitride, or silicon oxynitride.

In the display area DA, the transistor TR may be disposed on the buffer layer BFL. For example, the active layer ATV may be disposed on the buffer layer BFL, the gate electrode GE may be disposed on the active layer ATV, and the first electrode EL1 and the second electrode EL2 may be disposed on the gate electrode GE.

The active layer ATV may include an amorphous silicon, a polycrystalline silicon, an oxide semiconductor material or an organic semiconductor material. The active layer ATV may conduct a signal only when a voltage having a specific strength or higher is applied to the gate electrode GE.

The gate electrode GE may be connected to a gate wiring that applies an on/off signal to the transistor TR, and may include a low-resistance metallic material. For example, the gate electrode GE may have a single layer or a multilayer structure formed of a conductive material including molybdenum (Mo), aluminum (Al), copper (Cu), titanium (Ti), and the like.

The first electrode EL1 and the second electrode EL2 may have a single layer or multilayer structure including one or more conductive materials having a relatively high conductivity. For example, each of the first electrode EL1 and the second electrode EL2 may have a single layer or a multilayer structure formed of a conductive material including aluminum (Al), copper (Cu), titanium (Ti), or the like.

The transistor TR according to the embodiment shown in FIG. 3 is of a top gate type in which the gate electrode GE is disposed on the active layer ATV, but the present disclosure is not necessarily limited thereto. A thin film transistor according to another embodiment may be of a bottom gate type in which the gate electrode is disposed below a semiconductor layer.

In the display area DA, the first insulating layer IL1 may be disposed between the active layer ATV and the gate electrode GE. The first insulating layer IL1 may include an insulating material such as silicon oxide, silicon nitride, and silicon oxynitride. The first insulating layer IL1 may insulate the active layer ATV from the gate electrode GE. Additionally or alternatively, the second insulating layer IL2 may be disposed on the gate electrode GE, and the first electrode EL1 and the second electrode EL2 may be disposed on the second insulating layer IL2. The first electrode EL1 and the second electrode EL2 may be connected to the active layer ATV through contact holes. The contact holes may be holes penetrating through the first insulating layer IL1 and the second insulating layer IL2.

In the display area DA, the third insulating layer IL3 may be disposed on the transistor TR. The third insulating layer IL3 may substantially planarize an upper portion of the transistor TR. The third insulating layer IL3 may include an organic material such as acrylic, benzocyclobutene (BCB) or hexamethyldisiloxane (HMDSO).

In the display area DA, An organic light emitting diode OLED, which includes the anode electrode AE, the cathode electrode CE, and the light emitting layer EM interposed between the anode electrode AE and the cathode electrode CE, may be disposed on the third insulating layer IL3. The anode electrode AE may come into contact with the second electrode EL2 through an opening formed in the third insulating layer IL3, and may be electrically connected to the transistor TR. The organic light emitting diode OLED may receive a driving signal transmitted from the transistor TR and emit light having a luminance corresponding to the driving signal.

In the display area DA, a pixel defining layer PDL may be disposed on the third insulating layer IL3. The pixel defining layer PDL may have an opening corresponding to each pixel, for example, an opening through which at least a central portion of the anode electrode AE is exposed, so that the opening defines a pixel. The pixel defining layer PDL may be formed of an organic material such as polyimide or hexamethyldisiloxane (HMDSO).

The organic light emitting diode OLED may be easily damaged by moisture, oxygen, or the like from the outside. Accordingly, in the display area DA, an encapsulation layer ENL may cover and protect the organic light emitting diode OLED. The encapsulation layer ENL may include a first inorganic encapsulation layer, an organic encapsulation layer and a second inorganic encapsulation layer sequentially laminated.

In the display area DA, the protective film PTF may be disposed on a bottom surface of the substrate. The protective film PTF may protect the bottom surface of the substrate 100, and accordingly, the protective film PTF may have a rigidity different from the substrate 100. An adhesive layer including a pressure sensitive adhesive (PSA) for bonding the protective film PTF to the substrate 100 may be interposed between the substrate 100 and the protective film PTF.

In the bending area BA, the conductive layer 300 may be disposed on the substrate 100. The conductive layer 300 may also be disposed in a part of the substrate 100 in the display area DA (for example, a part of the display area DA adjacent to the bending area BA). For example, the conductive layer 300 may be disposed in the bending area BA and extend to the display area DA, and may be disposed on the second insulating layer IL2 while coming into contact with side surfaces of the buffer layer BFL, the first insulating layer IL1, and the second insulating layer IL2.

In the display area DA, the conductive layer 300 may be electrically connected to the connection electrode 200. For example, the conductive layer 300 may be electrically connected to the connection electrode 200 disposed on the first insulating layer IL1 through a through-hole formed in the first insulating layer IL1. The connection electrode 200 may be electrically connected to the transistor TR, and accordingly, the driving signal may be transmitted to the transistor TR through the conductive layer 300.

In the bending area BA, the bending protective layer BPL may be disposed on the conductive layer 300. The bending protective layer BPL may also be disposed in a part of the substrate 100 in the display area DA (for example, a part of the display area DA adjacent to the bending area BA). In one embodiment, the top surface of the conductive layer 300 and the bottom surface of the bending protective layer BPL may come into direct contact with each other in the bending area BA. For example, the conductive layer 300 may come into direct contact with the bending protective layer BPL in the bending area BA, and the bending protective layer BPL may cover at least a portion of the conductive layer 300. The bending protective layer BPL may minimize a tensile stress applied to the conductive layer 300 due to the bending of the substrate 100. Specifically, the stress neutral plane may be positioned in the vicinity of the conductive layer 300 through the bending protective layer BPL. Accordingly, when the substrate 100 is bent, the tensile stress applied to the conductive layer 300 may be minimized.

The conductive layer 300 may be vulnerable to external impurities. For example, when external moisture comes into contact with the conductive layer 300, the conductive layer 300 may be oxidized and the electrical conductivity of the conductive layer 300 may be lowered. The bending protective layer BPL may protect the conductive layer 300 from the external impurities. For example, the bending protective layer BPL may include cross-linking polymer. For example, the cross-linking polymer may inhibit water molecules from passing through the conductive layer 300. Accordingly, a water vapor transmission rate (WVRT) of the bending protective layer BPL may be decreased, and the conductive layer 300 may be protected from the external impurities.

The bending protective layer BPL may include conductive particles EP. The conductive particles EP may be able to pass throughout the bending protective layer BPL. When the substrate 100 is bent with a very small radius of curvature in the bending area BA, the thickness and modulus of the bending protective layer BPL may be limited within a predetermined range. Accordingly, even when the bending protective layer BPL is present on the conductive layer 300, a crack CRK may occur in the conductive layer 300 due to bending of the substrate 100. When the crack CRK occurs in the conductive layer 300, the driving signal may not be effectively transmitted to the transistor TR through the conductive layer 300, and accordingly, the display performance of the display device may decrease. When the substrate 100 is bent and the crack CRK occurs in the conductive layer 300, the conductive particles EP may fill in the crack CRK to prevent the decrease in performance. For example, in the case of a crack CRK, the conductive particles EP may fill in the gap of the conductive layer 300 made by the crack CRK, and allow the conductive layer 300 to effectively conduct a driving signal therein. In this case, the driving signal may be normally transmitted to the transistor TR through the conductive particles EP disposed in the crack CRK.

Figure 4:
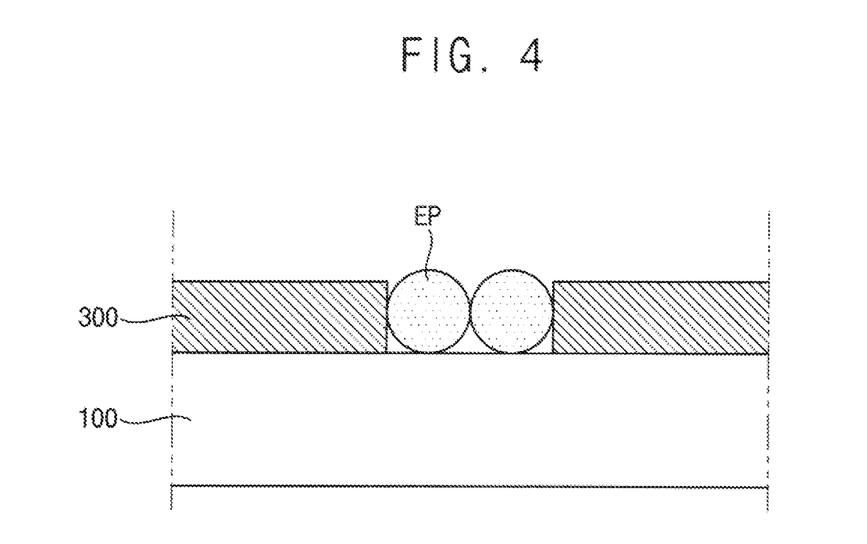
FIG. 4 is an enlarged view of area X1 of FIG. 3.
Figure 5:
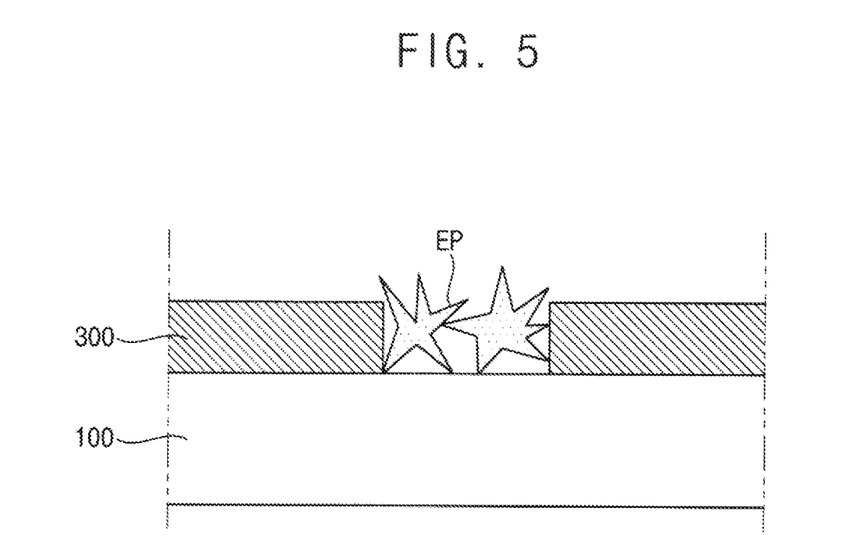
FIG. 5 is an enlarged view of area X1 of FIG. 3.

FIG. 4 is an enlarged view of area X1 of FIG. 3. FIG. 5 is an enlarged view of area X1 of FIG. 3.

Referring to FIGS. 4 and 5, the conductive particles EP may fill in the crack CRK of the conductive layer 300. The conductive particles EP may include a conductive material. Accordingly, even when the crack CRK occurs in the conductive layer 300, the driving signal provided by the driving circuit (IC in FIG. 2) may be transmitted to the transistor (TR in FIG. 3) through the conductive particles EP.

In one embodiment, the conductive particles EP may include metal. For example, the conductive particles EP may include aluminum (Al), silver (Ag), gold (Au), copper (Cu), iron (Fe), molybdenum (Mo), lead (Pb), zinc (Zn), or a combination thereof.

In another embodiment, the conductive particles EP may include conductive polymer. For example, the conductive particles EP may include poly(3,4-ethylenedioxythiophene) polystyrene sulfonate (PEDOT:PSS), polypyrrole, polyfuran, polythiophene, polyselenophene, 3,4-ethylenedioxythiophene (EDOP), 3,4-ethylenedioxyselenophene (EDOS), polyacetylene (PA), or polyaniline (PANI).

The conductive particles EP may have various shapes. For example, as shown in FIG. 4, the conductive particles EP may have a spherical shape. In some examples, the conductive particles EP may have a triangular pyramid shape or a rectangular parallelepiped shape. In one embodiment, as shown in FIG. 5, the conductive particles EP may have a dendrite shape. For example, the conductive particles EP may have a shape in which a dendritic skeleton is formed around a small nucleus. The shape of the nucleus may include a spherical shape, a triangular pyramid shape, a rectangular parallelepiped shape, and the like. The conductive particles EP having the dendrite shape may be formed by electrically depositing a solution containing metal ions.

Figure 6:
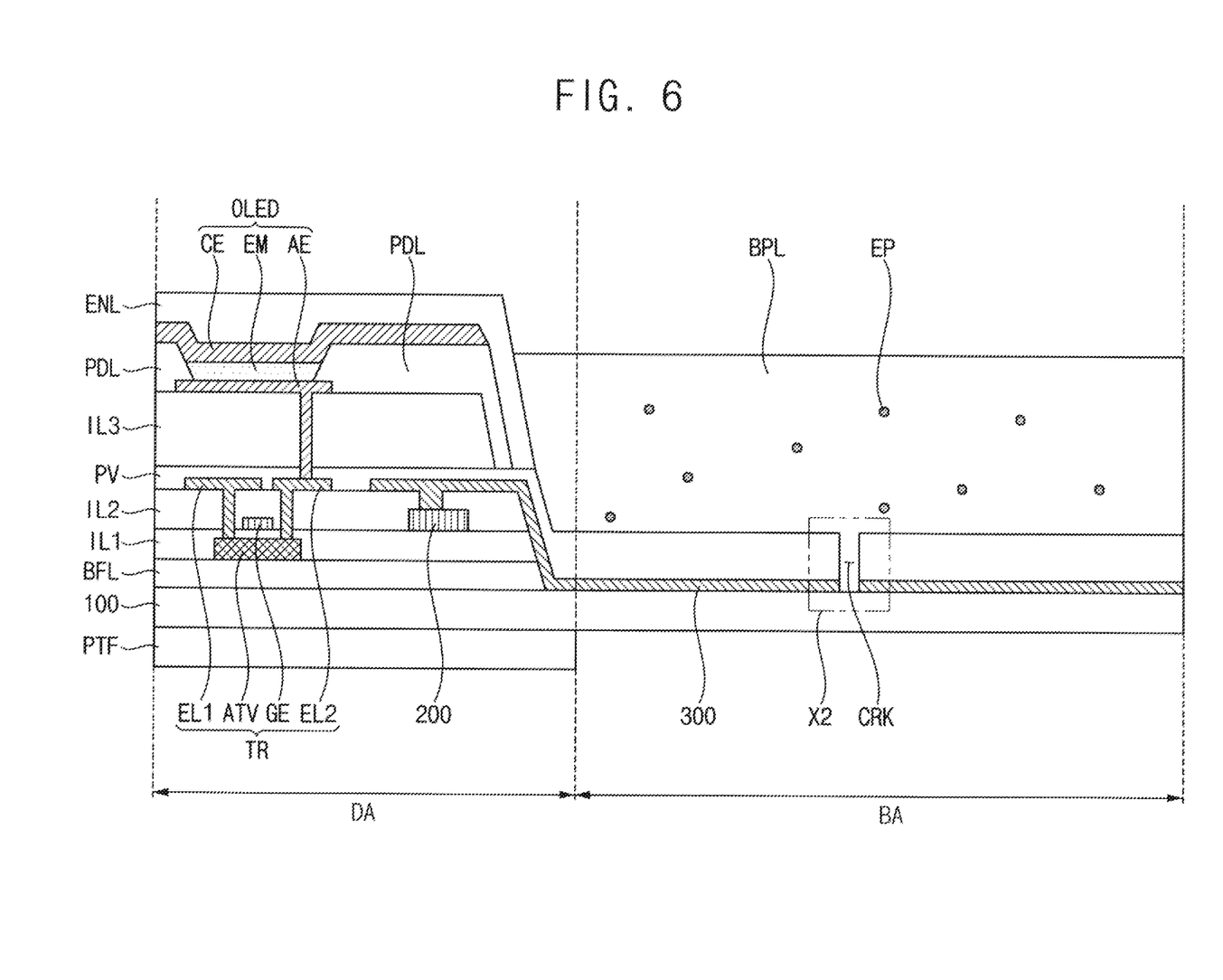
FIG. 6 is a cross-sectional view showing the display device according to an embodiment of the present disclosure.

FIG. 6 is a cross-sectional view showing the display device according to one embodiment of the present disclosure. For example, FIG. 6 may be a cross-sectional view taken along line I-I' of FIG. 2.

Referring to FIG. 6, the display device according to one embodiment of the present disclosure may include a substrate 100, a connection electrode 200, a conductive layer 300, a buffer layer BFL, a protective film PTF, first to third insulating layers IL1, IL2 and IL3, a passivation layer PV, a transistor TR, a pixel defining layer PDL, an organic light emitting diode OLED, and a bending protective layer BPL. The transistor TR may include a first electrode EL1, a second electrode EL2, a gate electrode GE, and an active layer ATV. The organic light emitting device OLED may include a cathode electrode CE, an anode electrode AE, and a light emitting layer EM. The display device of FIG. 6 may be similar to the display device described with reference to FIG. 3, except for the passivation layer PV. Accordingly, a description redundant with the description of FIG. 3 will be omitted.

In the bending area BA, the passivation layer PV may be disposed between the conductive layer 300 and the bending protective layer BPL. In addition, in the display area DA, the passivation layer PV may be disposed between the second insulating layer IL2 and the third insulating layer IL3. In one embodiment, in the display area DA, the passivation layer PV may contact a part of the pixel defining layer PDL and a part of the encapsulation layer ENL. The passivation layer PV may include polyimide (PI).

The passivation layer PV may protect the transistor TR. For example, the passivation layer PV may protect the first electrode EL1 and the second electrode EL2 while covering the first electrode EL1 and the second electrode EL2. In this case, the anode electrode AE included in the organic light emitting diode OLED may come into contact with the second electrode EL2 through openings formed in the third insulating layer IL3 and the passivation layer PV, and accordingly may be electrically connected to the transistor TR.

The passivation layer PV may also protect the conductive layer 300 from the bending of the substrate 100. For example, the stress neutral plane may be positioned in the vicinity of the conductive layer 300 through the passivation layer PV. Accordingly, when the substrate 100 is bent, the tensile stress applied to the conductive layer 300 may be minimized.

When the substrate 100 is bent and has a very small radius of curvature in the bending area BA, a crack CRK may occur in the conductive layer 300 and the passivation layer PV. When the crack CRK occurs in the conductive layer 300, the driving signal may not be effectively transmitted to the transistor TR through the conductive layer 300, and accordingly, the display performance of the display device may decrease. When the substrate 100 is bent and the crack CRK occurs in the conductive layer 300 and the passivation layer PV, the conductive particles EP may fill in the crack CRK to prevent the decrease in performance. In this case, the driving signal may be effectively transmitted to the transistor TR through the conductive particles EP disposed in the crack CRK.

Figure 7:
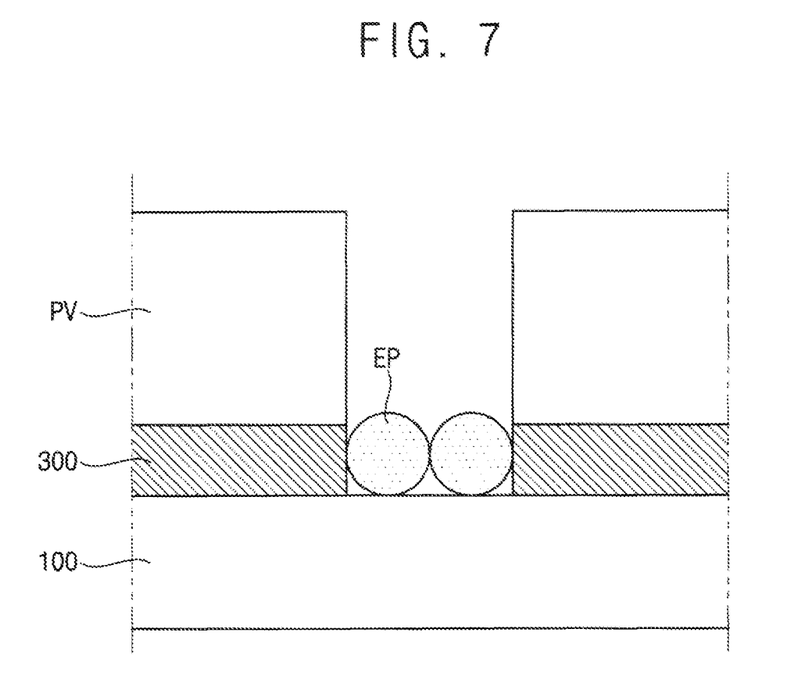
FIG. 7 is an enlarged view of area X2 of FIG. 6.

FIG. 7 is an enlarged view of area X2 of FIG. 6.

Referring to FIG. 7, the conductive particles EP may fill in the crack CRK generated in the conductive layer 300 and the passivation layer PV. The conductive particles EP may include a conductive material. Accordingly, even when the crack CRK occurs in the conductive layer 300, the driving signal provided by the driving circuit (IC in FIG. 2) may be transmitted to the transistor (TR in FIG. 3) through the conductive particles EP.

The conductive particles EP may include metal or conductive polymer. For example, the conductive particles EP may include aluminum (Al), silver (Ag), gold (Au), copper (Cu), iron (Fe), molybdenum (Mo), lead (Pb), zinc (Zn), poly(3,4-ethylenedioxythiophene) polystyrene sulfonate (PEDOT:PSS), polypyrrole, polyfuran, polythiophene, polyselenophene, 3,4-ethylenedioxythiophene (EDOP), 3,4-ethylenedioxyselenophene (EDOS), polyacetylene (PA), or polyaniline (PANI).

The conductive particles EP may have various shapes. For example, the conductive particles EP may have a spherical shape, a triangular pyramid shape, a rectangular parallelepiped shape, a dendrite shape, and the like.

Figure 8:
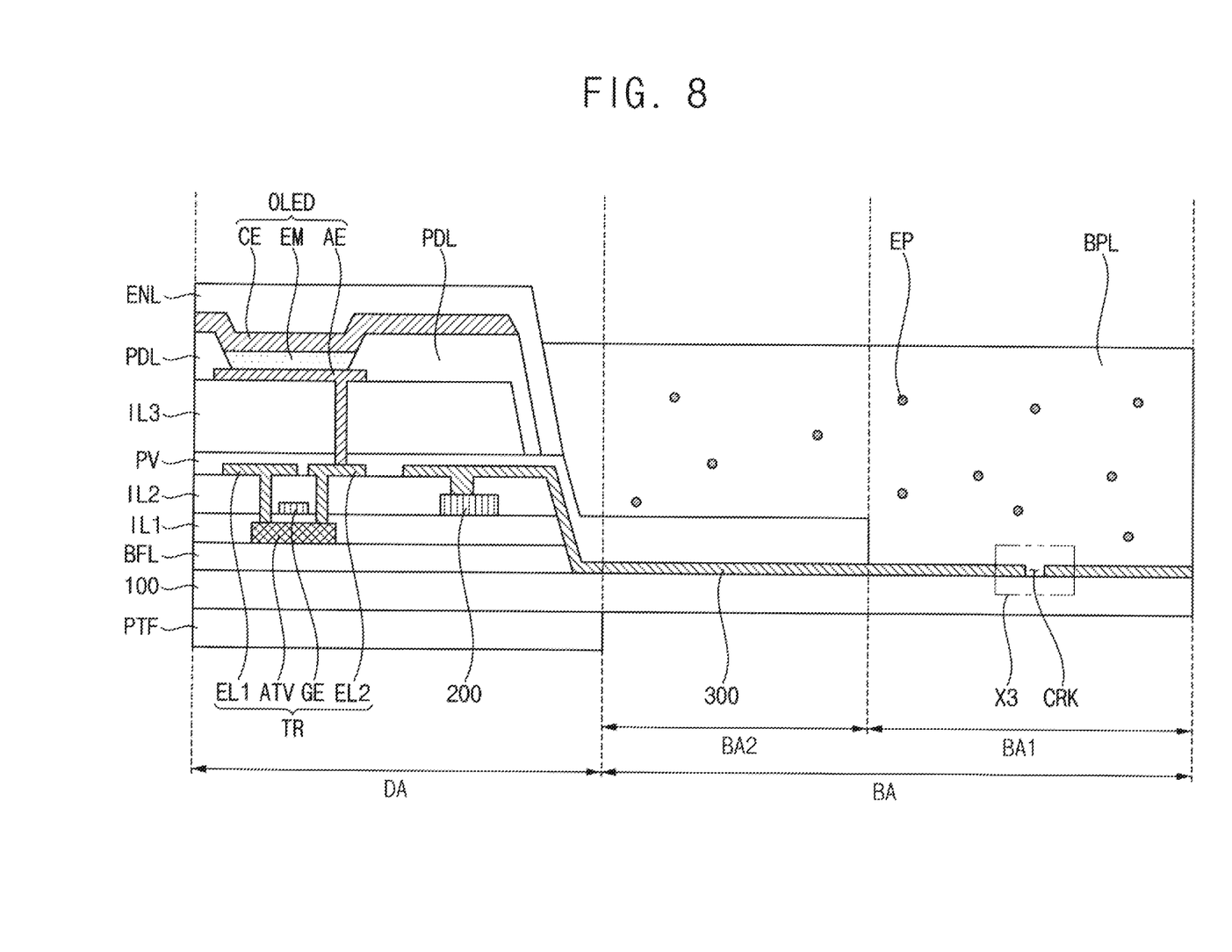
FIG. 8 is a cross-sectional view showing the display device according to an embodiment of the present disclosure.
Figure 9:
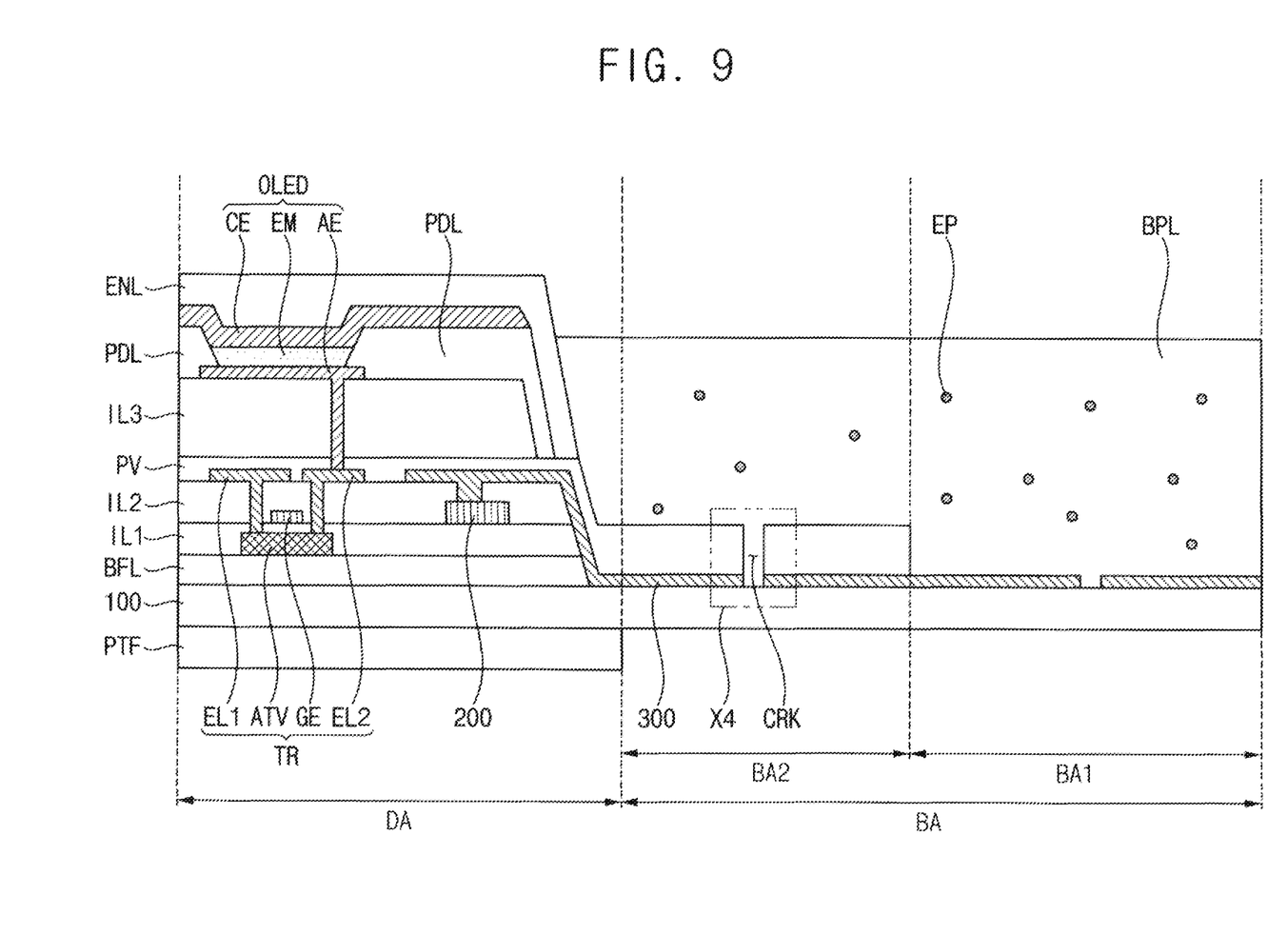
FIG. 9 is a cross-sectional view showing the display device according to an embodiment of the present disclosure.

FIG. 8 is a cross-sectional view showing the display device according to an embodiment of the present disclosure. For example, FIG. 8 may be a cross-sectional view taken along line I-I' of FIG. 2. FIG. 9 is a cross-sectional view showing the display device according to an embodiment of the present disclosure. For example, FIG. 9 may be a cross-sectional view taken along line I-I' of FIG. 2.

Referring to FIGS. 8 and 9, the display device according to an embodiment of the present disclosure may include a substrate 100, a connection electrode 200, a conductive layer 300, a buffer layer BFL, a protective film PTF, first to third insulating layers IL1, IL2 and IL3, a passivation layer PV, a transistor TR, a pixel defining layer PDL, an organic light emitting diode OLED, and a bending protective layer BPL. The transistor TR may include a first electrode EL1, a second electrode EL2, a gate electrode GE, and an active layer ATV. The organic light emitting device OLED may include a cathode electrode CE, an anode electrode AE, and a light emitting layer EM. The display device of FIGS. 8 and 9 may be similar to the display device described with reference to FIG. 6, except that the passivation layer PV is not disposed in the first bending area BA1. Accordingly, a description redundant with the description of FIG. 6 will be omitted.

The substrate 100 may include a display area DA, a first bending area BA1 spaced apart from the display area DA, and a second bending area BA2 positioned between the display area DA and the first bending area BA1. The first bending area BA1 and the second bending area BA2 may be areas in which the substrate 100 is bent. When the substrate 100 is bent in the first bending area BA1 and the second bending area BA2, the bent portion of the substrate 100 may have a predetermined radius of curvature.

The conductive layer 300 may be disposed on the substrate 100 in the first bending area BA1 and the second bending area BA2. In the example illustrated in FIG. 8, the passivation layer PV may be disposed on the conductive layer 300 in the second bending area BA2, and not necessarily disposed in the first being area BAL. The bending protective layer BPL may be disposed on the conductive layer 300 in the first bending area BA1, and may be disposed on the passivation layer PV in the second bending area BA2. The conductive layer 300 may come into direct contact with the bending protective layer BPL in the first bending area BA1.

Referring to FIG. 8, when the substrate 100 is bent and a crack CRK occurs in the conductive layer 300 in the first bending area BA1, the conductive particles EP may fill in the crack CRK. In this case, FIG. 4 may illustrate an enlarged view of area X3 of FIG. 8.

Referring to FIG. 9, when the substrate 100 is bent and a crack CRK occurs in both the conductive layer 300 and the passivation layer PV in the second bending area BA2, the conductive particles EP may fill in the crack CRK. In this case, FIG. 7 may illustrate an enlarged view of area X4 of FIG. 9.

Figure 10:
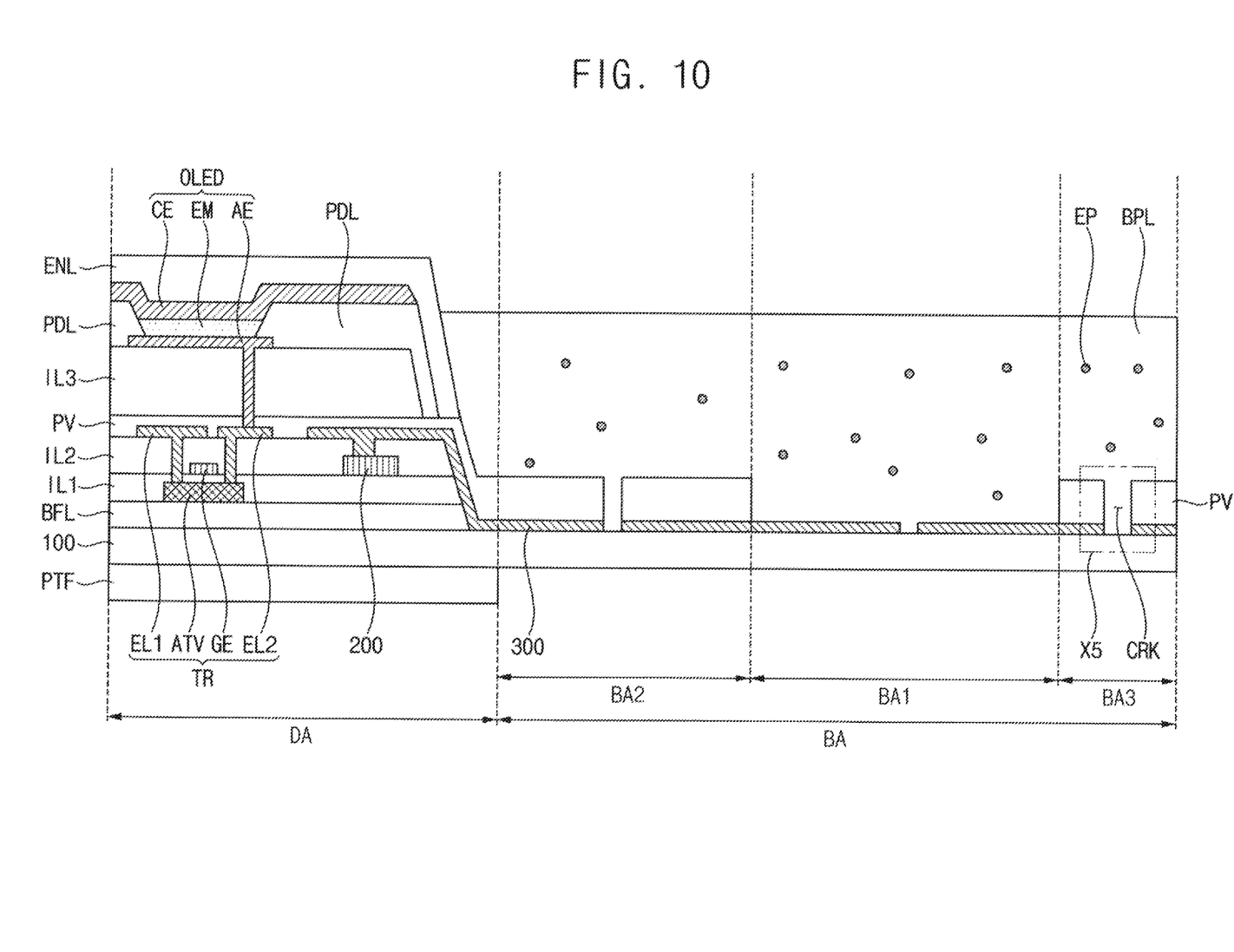
FIG. 10 is a cross-sectional view showing the display device according to an embodiment of the present disclosure.

FIG. 10 is a cross-sectional view showing the display device according to an embodiment of the present disclosure.

Referring to FIG. 10, the display device according to an embodiment of the present disclosure may include a substrate 100, a connection electrode 200, a conductive layer 300, a buffer layer BFL, a protective film PTF, first to third insulating layers IL1, IL2 and IL3, a passivation layer PV, a transistor TR, a pixel defining layer PDL, an organic light emitting diode OLED, and a bending protective layer BPL. The transistor TR may include a first electrode EL1, a second electrode EL2, a gate electrode GE, and an active layer ATV. The organic light emitting device OLED may include a cathode electrode CE, an anode electrode AE, and a light emitting layer EM. The display device of FIG. 10 may be similar to the display device described with reference to FIG. 6, except that the passivation layer PV is not disposed in the first bending area BAL. Accordingly, hereinafter, a description that is redundant with the description of FIG. 6 will be omitted.

The substrate 100 may include a display area DA, a first bending area BA1 spaced apart from the display area DA, and a second bending area BA2 positioned between the display area DA and the first bending area BA1. In addition, the substrate 100 may include a third bending area BA3 adjacent to the first bending area BA1 and spaced apart from the second bending area BA2. The first bending area BA1, the second bending area BA2, and third bending area BA3 may be areas in which the substrate 100 is bent. When the substrate 100 is bent in the first bending area BA1, the second bending area BA2, and third bending area BA3, the bent portions of the substrate 100 may have a predetermined radius of curvature.

The conductive layer 300 may be disposed on the substrate 100 in the first bending area BA1, the second bending area BA2, and third bending area BA3. The passivation layer PV may be disposed on the conductive layer 300 in the second bending area BA2 and third bending area BA3, but in this example, the passivation layer PV may not necessarily be disposed in the first bending area BA1. The bending protective layer BPL may be disposed on the conductive layer 300 in the first bending area BA1, and may be disposed on the passivation layer PV in the second bending area BA2 and third bending area BA3. The conductive layer 300 may come into direct contact with the bending protective layer BPL in the first bending area BA1.

When the substrate 100 is bent and a crack CRK occurs in the conductive layer 300 and the passivation layer PV in the third bending area BA3, the conductive particles EP may fill in the crack CRK. In this case, FIG. 7 may be illustrate an enlarged view of area X5 of FIG. 10.

The inventive concepts contained herein may be applied to a display device and an electronic apparatus including the same. For example, the inventive concepts may be applied to high-resolution smartphones, mobile phones, smart pads, smart watches, tablet PCs, vehicle navigation systems, televisions, computer monitors, notebook computers, and the like.

Although the display device according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device comprising:
    a substrate including a display area and a bending area adjacent to the display area;
    a conductive layer disposed on the substrate in the bending area, wherein the conductive layer is configured to transmit driving signals from a driving circuit to a display unit; and
    a bending protective layer disposed on the conductive layer in the bending area, wherein
    the bending protective layer includes conductive particles.

2. The display device of claim 1, wherein the conductive particles are able to pass throughout the bending protective layer.

3. The display device of claim 1, wherein, when the substrate is bent and a crack occurs in the conductive layer, the conductive particles fill into the crack.

4. The display device of claim 1, wherein the conductive layer directly contacts the bending protective layer in the bending area.

5. The display device of claim 1, wherein the bending protective layer includes a cross-linking polymer.

6. The display device of claim 1, wherein the conductive particles include a metal.

7. The display device of claim 6, wherein the metal includes aluminum (Al), silver (Ag), gold (Au), copper (Cu), iron (Fe), molybdenum (Mo), lead (Pb), or zinc (Zn).

8. The display device of claim 1, wherein the conductive particles comprise a conductive polymer.

9. The display device of claim 8, wherein the conductive polymer includes poly(3,4-ethylenedioxythiophene) polystyrene sulfonate (PEDOT:PSS), polypyrrole, polyfuran, polythiophene, polyselenophene, 3,4-ethylenedioxythiophene (EDOP), 3,4-ethylenedioxyselenophene (EDOS), polyacetylene (PA), or polyaniline (PANI).

10. The display device of claim 1, wherein the conductive particles have a spherical shape, a triangular pyramid shape, or a rectangular parallelepiped shape.

11. The display device of claim 1, wherein the conductive particles have a dendrite shape.

12. The display device of claim 1, further comprising:
    a passivation layer disposed between the conductive layer and the bending protective layer in the bending area.

13. The display device of claim 12, wherein, when the substrate is bent and a crack occurs in the conductive layer and the passivation layer, the conductive particles fill into the crack.

14. A display device comprising:
    a substrate including a display area, a first bending area spaced apart from the display area, and a second bending area positioned between the display area and the first bending area;
    a conductive layer disposed on the substrate in the first bending area and the second bending area, wherein the conductive layer is configured to transmit driving signals from a driving circuit to a display unit;
    a passivation layer disposed on the conductive layer in the second bending area; and
    a bending protective layer disposed on the conductive layer in the first bending area, and disposed on the passivation layer in the second bending area, wherein the bending protective layer includes conductive particles.

15. The display device of claim 14, wherein the conductive particles are able to pass throughout the bending protective layer.

16. The display device of claim 14, wherein the conductive layer directly contacts the bending protective layer in the first bending area.

17. The display device of claim 14, wherein, when the substrate is bent and a crack occurs in the conductive layer in the first bending area, the conductive particles fill into the crack.

18. The display device of claim 14, wherein, when the substrate is bent and a crack occurs in the conductive layer and the passivation layer in the second bending area, the conductive particles fill into the crack.

19. The display device of claim 14, wherein the substrate further includes a third bending area adjacent to the first bending area and spaced apart from the second bending area, the conductive layer is disposed on the substrate in the third bending area, the passivation layer is disposed on the conductive layer in the third bending area, and the bending protective layer is disposed on the passivation layer in the third bending area.

20. The display device of claim 19, wherein, when the substrate is bent and a crack occurs in the conductive layer and the passivation layer in the third bending area, the conductive particles fill into the crack.

* * * * *